United States Patent
Zhang et al.

(10) Patent No.: US 10,049,757 B2
(45) Date of Patent: Aug. 14, 2018

(54) TECHNIQUES FOR DYNAMICALLY DETERMINING PERFORMANCE OF READ RECLAIM OPERATIONS

(71) Applicant: SK Hynix Inc., Gyeonggi-do (KR)

(72) Inventors: Fan Zhang, Fremont, CA (US); Yu Cai, San Jose, CA (US); Chenrong Xiong, San Jose, CA (US); Aman Bhatia, San Jose, CA (US); HyungSeok Kim, Santa Clara, CA (US); David Pignatelli, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/495,590

(22) Filed: Apr. 24, 2017

(65) Prior Publication Data

US 2018/0047456 A1    Feb. 15, 2018

Related U.S. Application Data

(60) Provisional application No. 62/373,891, filed on Aug. 11, 2016.

(51) Int. Cl.
| | | |
|---|---|---|
| *G11C 16/10* | (2006.01) | |
| *G11C 16/34* | (2006.01) | |
| *G11C 16/26* | (2006.01) | |

(52) U.S. Cl.
CPC ......... *G11C 16/3431* (2013.01); *G11C 16/26* (2013.01); *G11C 16/349* (2013.01)

(58) Field of Classification Search
CPC ................ G11C 16/10; G11C 16/26

USPC ...................... 365/185.02, 185.24
See application file for complete search history.

(56) References Cited

U.S. PATENT DOCUMENTS

| | | | |
|---|---|---|---|
| 7,818,525 B1 | 10/2010 | Frost et al. | |
| 8,806,106 B2 * | 8/2014 | Goss | G11C 16/349 |
| | | | 711/103 |
| 8,930,778 B2 | 1/2015 | Cohen | |
| 9,098,416 B2 | 8/2015 | Mataya et al. | |
| 9,146,855 B2 * | 9/2015 | Lambert | G06F 12/0246 |
| 9,519,576 B2 * | 12/2016 | Seo | G06F 12/0246 |
| 9,594,673 B2 * | 3/2017 | Kim | G06F 12/0246 |
| 9,658,800 B2 * | 5/2017 | Darragh | G06F 3/0653 |
| 9,778,851 B2 * | 10/2017 | Park | G06F 3/061 |
| 9,870,159 B2 * | 1/2018 | Cepulis | G06F 3/0616 |
| 2010/0235713 A1 * | 9/2010 | Lee | G06F 11/1072 |
| | | | 714/763 |
| 2013/0031443 A1 * | 1/2013 | Oh | G11C 11/5628 |
| | | | 714/773 |
| 2014/0032939 A1 * | 1/2014 | Jeddeloh | G06F 1/3234 |
| | | | 713/300 |
| 2015/0242143 A1 * | 8/2015 | Kim | G06F 3/0619 |
| | | | 714/704 |
| 2015/0242338 A1 * | 8/2015 | Lee | G06F 12/1483 |
| | | | 711/103 |

(Continued)

*Primary Examiner* — Michael Tran
(74) *Attorney, Agent, or Firm* — Kilpatrick Townsend & Stockton LLP

(57) ABSTRACT

Disclosed are techniques for determining a threshold number of read operations on memory depending on one or more conditions of the memory. If a number of read operations for the memory meets the threshold number of read operations, a read reclaim operation can be performed to preserve data stored therein.

20 Claims, 8 Drawing Sheets

(56) References Cited

U.S. PATENT DOCUMENTS

| | | | |
|---|---|---|---|
| 2015/0355845 A1* | 12/2015 | Lee .................. | G06F 3/0679 |
| | | | 711/103 |
| 2016/0055917 A1* | 2/2016 | Lee .................. | G11C 16/34 |
| | | | 365/185.11 |
| 2016/0093394 A1* | 3/2016 | Lee .................. | G11C 16/26 |
| | | | 365/185.12 |
| 2016/0162375 A1* | 6/2016 | Kim .................. | G06F 3/0619 |
| | | | 714/6.13 |
| 2016/0203047 A1* | 7/2016 | No .................. | G06F 11/1068 |
| | | | 714/764 |
| 2016/0217032 A1* | 7/2016 | Yum ................ | G06F 11/1048 |
| 2016/0231945 A1* | 8/2016 | Choudhuri .......... | G06F 3/0608 |
| 2017/0161202 A1* | 6/2017 | Erez ................. | G06F 12/10 |

* cited by examiner

TECHNIQUES FOR DYNAMICALLY DETERMINING PERFORMANCE OF READ RECLAIM OPERATIONS

CROSS-REFERENCES TO RELATED APPLICATIONS

The present application claims priority to U. S. Provisional Application No. 62/373,891, entitled "DYNAMIC SPRD BASED ON OPERATION CONDITION," filed Aug. 11, 2016, which is commonly assigned and expressly incorporated by reference herein in its entirety for all purposes.

BACKGROUND OF THE INVENTION

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Data stored in solid-state memory devices may degrade over time. In order to avoid degradation of stored data, read reclaim operation(s) may be performed. Read reclaim operation(s) may copy data from one location in memory to another location in order to preserve the data. However, each read reclaim operation may impact memory longevity and/or use system resources. Thus, there is need for improvement in the field of solid state memory.

BRIEF SUMMARY OF THE INVENTION

Disclosed herein are techniques to dynamically assess when a read reclaim operation is to be performed. Memory, such as flash memory, may be configured to store data therein depending on charged state(s) of memory cells of the memory. The charged state(s) can be read as a voltage level respectively corresponding to each of the memory cells. Over time and/or do to operating conditions, data stored within memory cells can degrade over time. If the data stored within the memory cells sufficiently degrades, the data stored therein can become corrupted as the data may become irretrievable. Furthermore, in certain memory constructs, performing a memory operation (e.g., read write) on one memory cell can effects other memory cells. To mitigate memory degradation, a memory controller may be configured to periodically perform a read reclaim operation on memory cells of memory (e.g., on a block or page of memory cells).

Data stored within certain memory cells can be degraded based upon operational condition(s) of the memory cells. For example, each read operation performed on the memory cells can degrade a respective charge of each of the memory cells. The degradation caused by read operations can accumulate as the read operations are performed on the memory cells. Thus, one techniques to determine when a read reclaim operation should be performed on the memory cells is to determine a threshold number of read operations that, when met, triggers performance of a read reclaim operation. However, various methodologies can be used to determine the threshold number of read operations for performing a read reclaim operation. For example, a threshold number of read operations may be chosen to account for a worst case scenario (e.g., end-of-life conditions) of memory cells and may include a margin of error to ensure that read reclaim operations are performed at sufficient numbers of read operations to prevent degradation of memory prior to end-of-life of the memory.

Longevity of memory cells can also be degraded each time a memory cell is written to. Furthermore, degradation of memory cells due to read or write operations can be exasperated due to advanced memory manufacturing techniques (e.g., decreasing lithographic feature sizes, three-dimensional stacking of memory cells, etc.). Thus, each read reclaim operation can degrade the operational life of memory cells by reading from and/or writing to memory cells. Furthermore, each read reclaim operation may consume memory controller resources. For example, cycles of a processor of a memory controller, buffer(s), bus bandwidth, or other resources of the controller may be consumed to perform each read reclaim operation. Thus, determination of when to perform a read reclaim operation may balance several (sometimes opposing) results. For example, ensuring that memory does not become corrupt due to excessive memory read operations may be balanced with impacting memory longevity as a result of performing excessive read reclaim operations.

Disclosed are techniques to dynamically determine when to perform a read reclaim operation. By dynamically determining when to perform read reclaim operations, superfluous read reclaim operation(s) may be avoided, thus improving longevity of memory by mitigating unnecessary read or write operations and relieving memory controller(s) of burdens of unnecessarily moving data between memory cell(s). Preventing memory controller(s) from performing unnecessary read reclaim operation(s) can improve performance and/or reduce power consumption of the memory controller(s). Using the disclosed techniques, necessary numbers of read reclaim operation(s) may be dynamically determined to be performed at appropriate intervals to mitigate memory cell data corruption.

Disclosed are techniques to implement a device comprising a memory and a controller. The memory can include memory cells arranged such that reading a value of one of the memory cells includes applying a voltage to others of the memory cells. The controller can be configured to determine one or more conditions of one or more of the memory cells. The controller can also be configured to determine, based on the one or more conditions, a threshold number of read operations to perform a read reclaim operation to prevent a value stored within one or more of the memory cells to become corrupted by one or more voltages applied to the one or more of the memory cells. The controller can further be configured to determine a number of read operations performed on one or more of the memory cells. The one or more conditions can be separate and distinct from the number of read operations. The controller can also be configured to determine whether the number of read operations meets the threshold number of read operations. The controller can be configured to, in response to determining that the number of read operations meets the threshold number of read operations, perform the read reclaim operation.

The controller can also be configured to, in response to determining that the number of read operations does not meet the threshold number of read operations, not perform the read reclaim operation. The controller can be further configured to determine the threshold number of read operations from a baseline number of read operations, including modifying the baseline number of read operations based on the one or more conditions. The baseline number of read operations can be determined based on an end-of-life projection for the one or more of the memory cells. The end-of-life projection can be based on at least one of: a worst case number of program erase cycles that the one or more of the memory cells is anticipated to be subjected to over an operational lifetime; or a worst case retention time for the one or more of the memory cells to store data without degradation.

The one or more conditions can include a number of program and erase cycles that the one or more memory cells have been subjected to. The one or more conditions can include a retention time that the one or more cells have maintained a value of data stored therein. The one or more conditions can include a temperature determined by a sensor coupled to the memory. The one or more conditions can include a humidity determined by a sensor coupled to the memory. The memory can include flash memory and the reading the value of one of the memory cells can include applying a voltage a wordline of the flash memory. The one or more conditions and the number of read operations can be tracked for a plurality of the memory cells, the plurality of the memory cells including the one or more memory cells. The read reclaim operation can include copying values from the plurality of the memory cells to another plurality of the memory cells.

The controller can be further configured to store a plurality of threshold numbers of read operations, each of the plurality of threshold numbers of read operations corresponding to a set of one or more conditions of the memory cells. Determining the threshold number of read operations can includes selecting, from the threshold numbers of read operations, the threshold number of read operations. The memory cells can be arranged in a planar array wherein the one or more memory cells are addressed via row and column addressing.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1A:
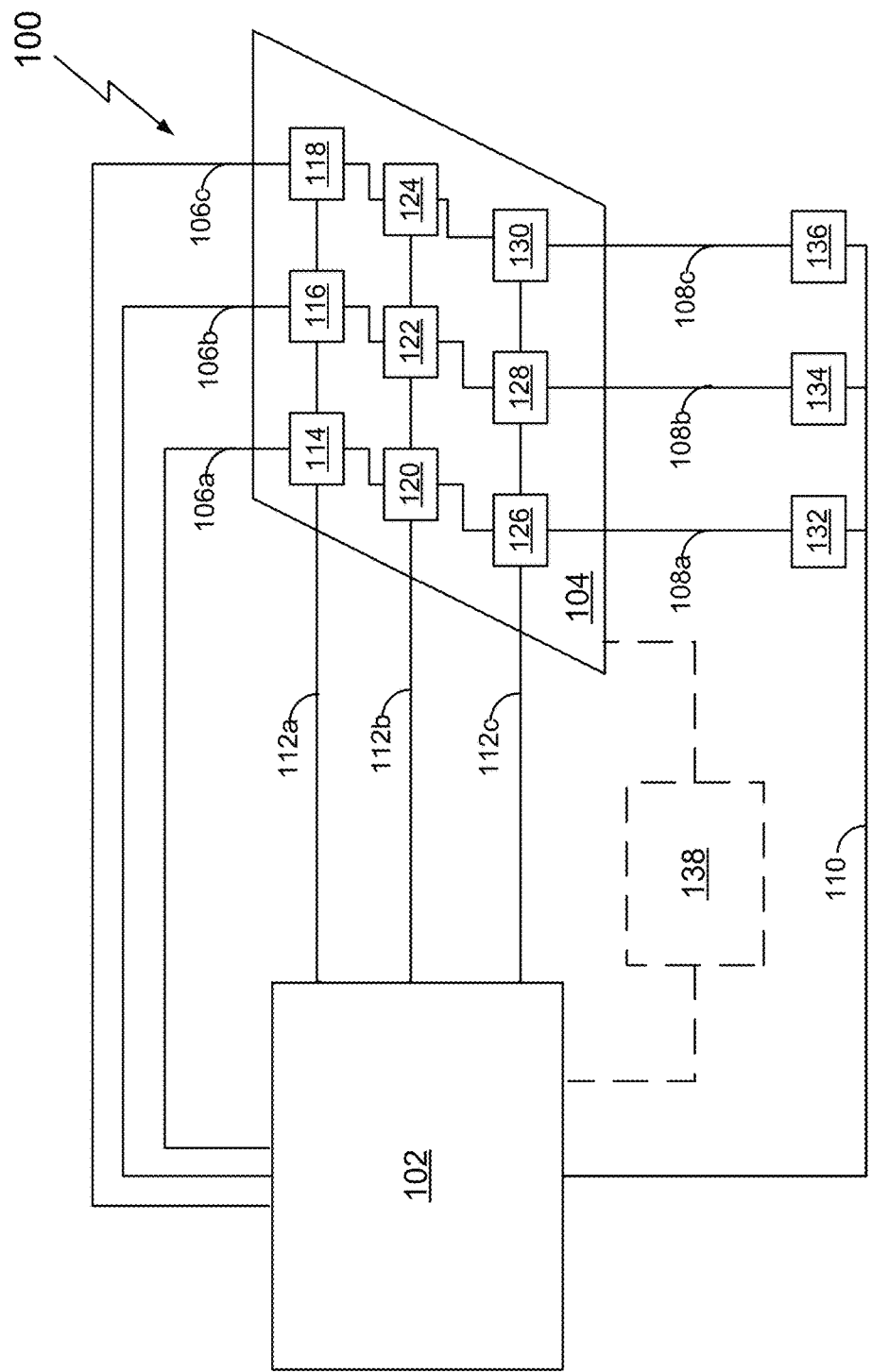
FIG. 1A illustrates a simplified block diagram of a planar memory construct.

FIG. 1A illustrates a system 100 including a planar memory cells 104. Planar memory cells 104 can be a two-dimensional memory construct that may be manufactured using deposition techniques. As illustrated, controller 102, can interface with planar memory cells 104. Controller 102 can be configured to determine (i.e., read) state(s) of one or more memory cells 114-130 of planar memory cells 104. Controller 102 can be configured to write to one or more of memory cells 114-130. The read and write operations can be performed in parallel and in any combination. Although not illustrated, controller 102 can interface with a central processing unit (CPU) via a bus (e.g., a peripheral component interface (PCI)). Controller 102 can include processor(s) (x86, ARM, etc.), buffer(s), driver(s), programmable logic device(s), an application specific integrated circuit (ASIC), etc. Controller 102 can interface with memory (not shown) to load and/or implement firmware or other instructions that, when executed by controller 102, can configured controller 102 to provide an interface between planar memory cells 104 and external device(s).

Planar memory cells 104 can include, for example, flash memory. In order to determine a value stored by a flash memory cell, controller 102 can induce a voltage to the memory cell. If the flash memory cell conducts after the voltage is applied, controller 102 may determine that the flash memory cell stores a value. As a simple example, a closed state of a flash memory cell can indicate that the memory cell stores a logic 1. If the memory cell does not conduct upon application of a voltage, then controller 102 may determine that the memory cell stores a logic 0. Certain flash memory cells can be used to store one of several states. For example, a flash memory cell may store 3, 4, 8, or other numbers of states. As one example, a flash memory cell can conduct when a certain threshold voltage is applied. For example, a 0.5V threshold may correspond to a second state out of eight. In the example, the flash memory cell storing the second state may conduct if 0.5V or more is applied to the memory cell. Similarly, a 0.8V threshold may correspond to a third state out of the eight example states. As such, the flash memory cell storing the third state may conduct when 0.8V or more is applied to the flash memory cell.

Controller 102 can be configured to apply voltage(s) sequentially, for example, to determine state(s) of flash memory cells. Controller 102 may apply increasing voltage(s) via a digital-to-analog converter, for example. Controller 102 can also determine when certain memory cell(s) conduct as the voltage(s) are increased to determine state(s) of memory cell(s).

Addressability of memory cells within a memory construct (e.g., planar memory cells 104) can becomes cumbersome as, for example, a number of memory cells disposed within planar memory cells 104 is increased. For example, one control schema to address each of memory cells 114-130 may be to provide a corresponding unique control line between controller 102 and each of memory cells 114-130. However, such a schema may result in an unnecessary multitude of traces, drivers, senses, etc. As illustrated, row and column addressing can be used to determine a value of a specific memory cell of planar memory cells 104. For example, control lines 106a-c and 110 can be used as column drivers (which may also be referred to as bitlines). Control line 110 can be a common ground. When control line 106a is driven, a voltage may be applied to memory cells 114, 120, and 126. Similarly, memory cells 116, 122, and 128 may be energized by control line 106b and memory cells 118 124, and 130 can be energized by control line 106c. Control lines 112a-112c can be considered row drivers (or wordlines). When control line 112a is energized, memory cells 114, 116, and 118 may be energized. Likewise, control line 112*b* can correspond to and energize memory cells 120, 122, and 124 and control line 112*c* can correspond to and energize memory cells 126, 128, and 130.

Sense amplifiers 132, 134, and 136 can be connected to respective memory cells via control lines 108*a*-108*c*. Note that sense amplifiers 132-136 may, in certain embodiments, be integrated into controller 102. As an example use case, controller 102 may perform a read operation to determine a state of memory cell 120. As such, controller 102 may sequentially provide one or more threshold voltages (as disclosed herein regarding multi-state memory cells) to determine a state of memory cell 120. If memory cell 120 is a flash memory cell and conducts corresponding to one of the one or more threshold voltages, the state of memory cell 120 can be determined by applying various voltages to memory cell 120. However, as illustrated, memory cells 114 and 126 may be in series with memory cell 120 along control line (bitline) 106*a*. In order to prevent memory cells 114 and 126 from interfering with the read operation of memory cell 120, control lines (wordlines) 112*a* and 112*c* may be energized with a reference voltage selected to ensure that memory cells 114 and 126 conduct regardless of a values stored therein. In such a manor, the state of memory cell 120 can be determined for only memory cell 120 by sense amplifier 132 even though memory cells 126 and 114 may be electrically in series with memory cell 120 between control line 106*a* and sense amplifier 132.

FIG. 1A also illustrates a sensor unit 138 which may include, for example, one or more of a temperature, humidity, shock, or other environmental sensor that may be used to determine one or more aspects of an environment to which memory cells 114-130 are subjected to. Environmental information can be used to characterize and/or adjust thresholds for performing read reclaim operations on memory cells 114-130 as environmental conditions change.

Figure 1B:
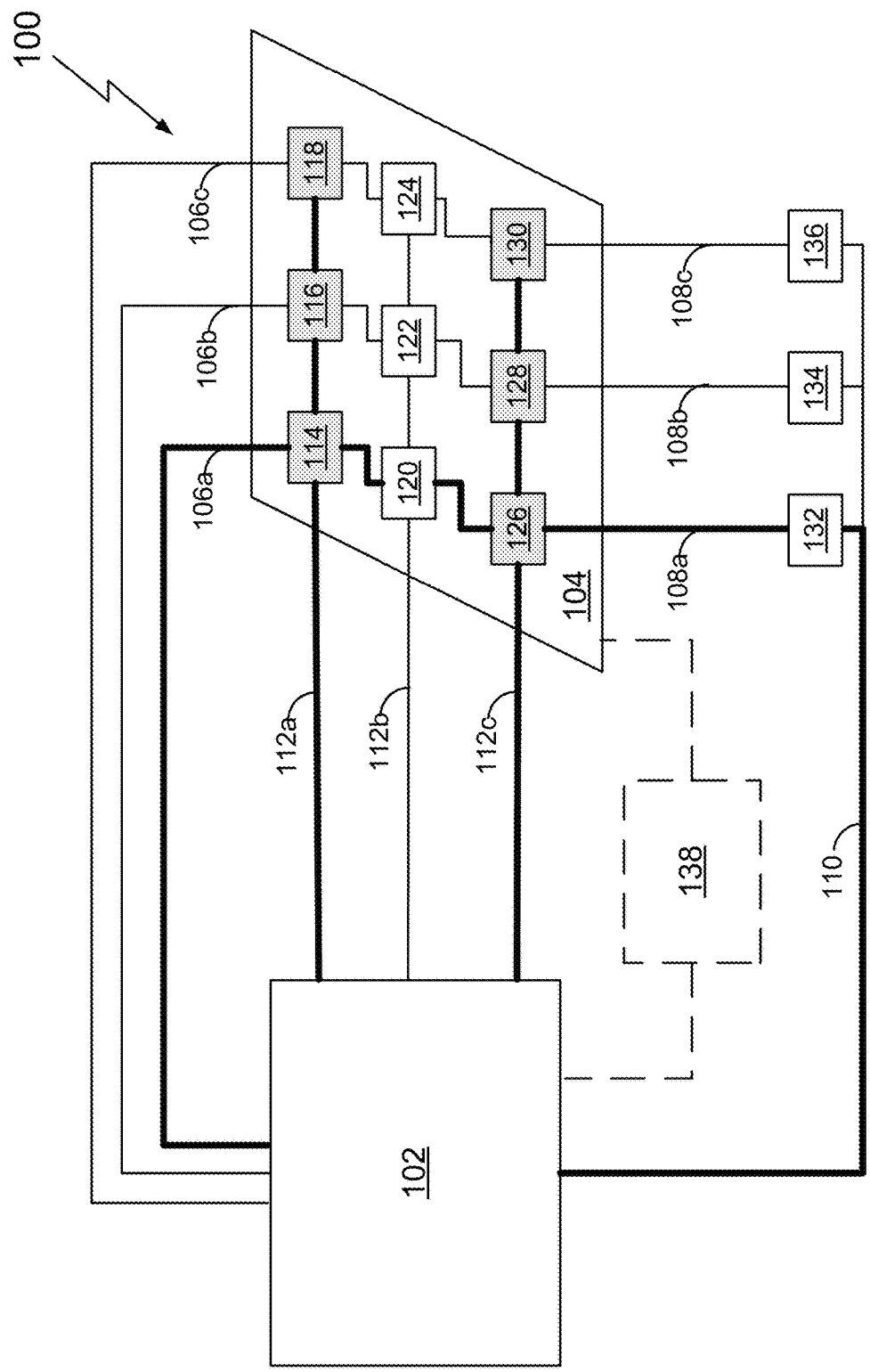
FIG. 1B illustrates features of the planar memory construct of FIG. 1A.

FIG. 1B illustrates several features pertaining to accessing memory cells 114-130 of system 100. As disclosed herein, reading a value from memory cell 120 may include applying a voltage to memory cells 114-118 and/or 126-130. For example, in order to determine data stored within a flash memory cell, a read reference voltage may be applied to a transistor corresponding to the cell. If the read reference voltage is higher than a voltage corresponding to a value of data stored therein, the transistor may conduct (i.e., be turned on). The read reference voltage may be applied to control line 106*a* (e.g., a bitline), for example, that may apply the read reference voltage to each of memory cells 114, 120, and 126. Sense amplifier 132 may read a voltage conducted by memory cells 114, 120 and 126, to determine if the memory cell(s) conduct. In order to isolate memory cell 120 from memory cells 114 and 126 a voltage (i.e., a pass-through voltage) may be applied to memory cells 114 and 126 that ensures that memory cells 114 and 126 conduct.

Of note, memory cells 114 and 126 may not be the target of the read operation, however the pass-through voltage can be applied to memory cells 114 and 126 to determine a value of memory cell 120. Control line 112*a* (e.g., a wordline) may be configured to apply a pass-through voltage on memory cell 114 (which may also induce a voltage on memory cells 116 and 118). Similarly control line 112*c* may be configured to apply a pass-through voltage on memory cell 126 (which may also induce a voltage on memory cells 128 and 130). This effects is illustrated by memory cells 114-118 and 126-130 being greyed in the illustration.

The application of the pass-through voltage to memory cells 114 and 126 may induce electric tunneling within transistors corresponding to memory cell 114 and 126 that may alter voltage(s) needed to determine value(s) of data stored therein. Thus, reading a value of one memory cell within a memory cell of flash memory can disturb cell contents of neighboring memory cells. As transistors becomes increasing miniscule due to improvements in process technology, transistor oxides can become thinner which can further contribute to susceptibility to disturbances due to application of voltage to a memory cell. Furthermore, the disturbances can become cumulative as voltages are applied to the memory cells.

Figure 1C:
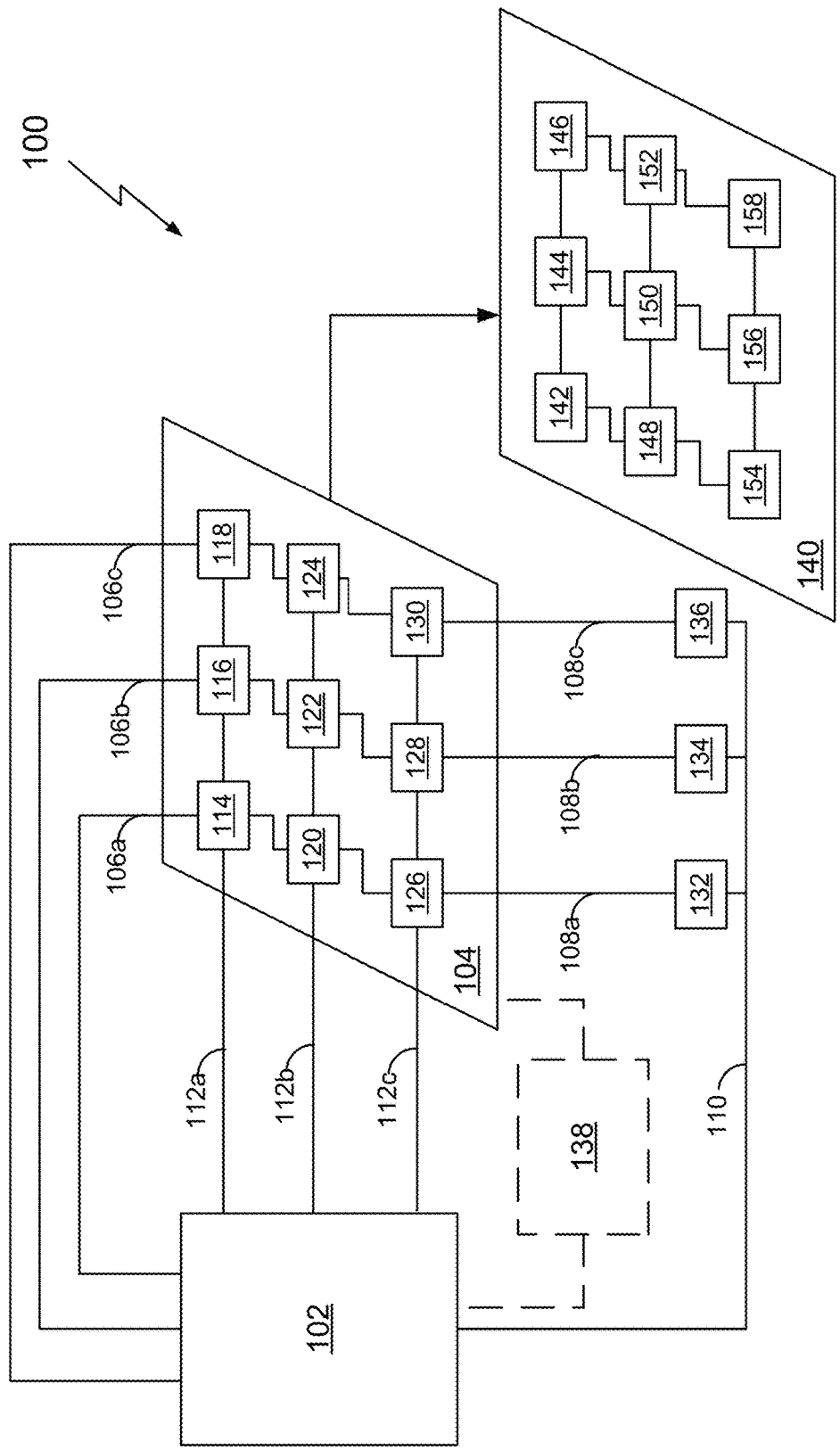
FIG. 1C illustrates further features of the planar memory construct of FIG. 1A.

FIG. 1C illustrates further features of system 100. As illustrated, planar memory cells 104 can be a logical or physical arrangement of memory cells 114-130 within a larger memory construct (e.g., a memory circuit integrated circuit die or package). Memory cells 140 can be a logical or physical arrangement of memory cells 142-156. Planar memory cells 104 and memory cells 140 can each be a layer of memory cells within a three-dimensional memory construct, a page of memory cells, a block of memory cells, or other. During a read reclaim operations, values of data stored within planar memory cells 104 can be copied to memory cells 140. Memory cells 140 can be elected to write the data to by determining, for example, that memory cells 140 do not store data or store stale data and/or that memory cells 140 contain sufficient storage volume to receive the data stored within planar memory cells 104. Thus, controller 102, upon determining that a read reclaim operation is desirable for planar memory cells 104, may select memory cells 140, read data contained within planar memory cells 104, and write the data to memory cells 140. Planar memory cells 104 may then be erased and/or flagged as stale.

Figure 2:
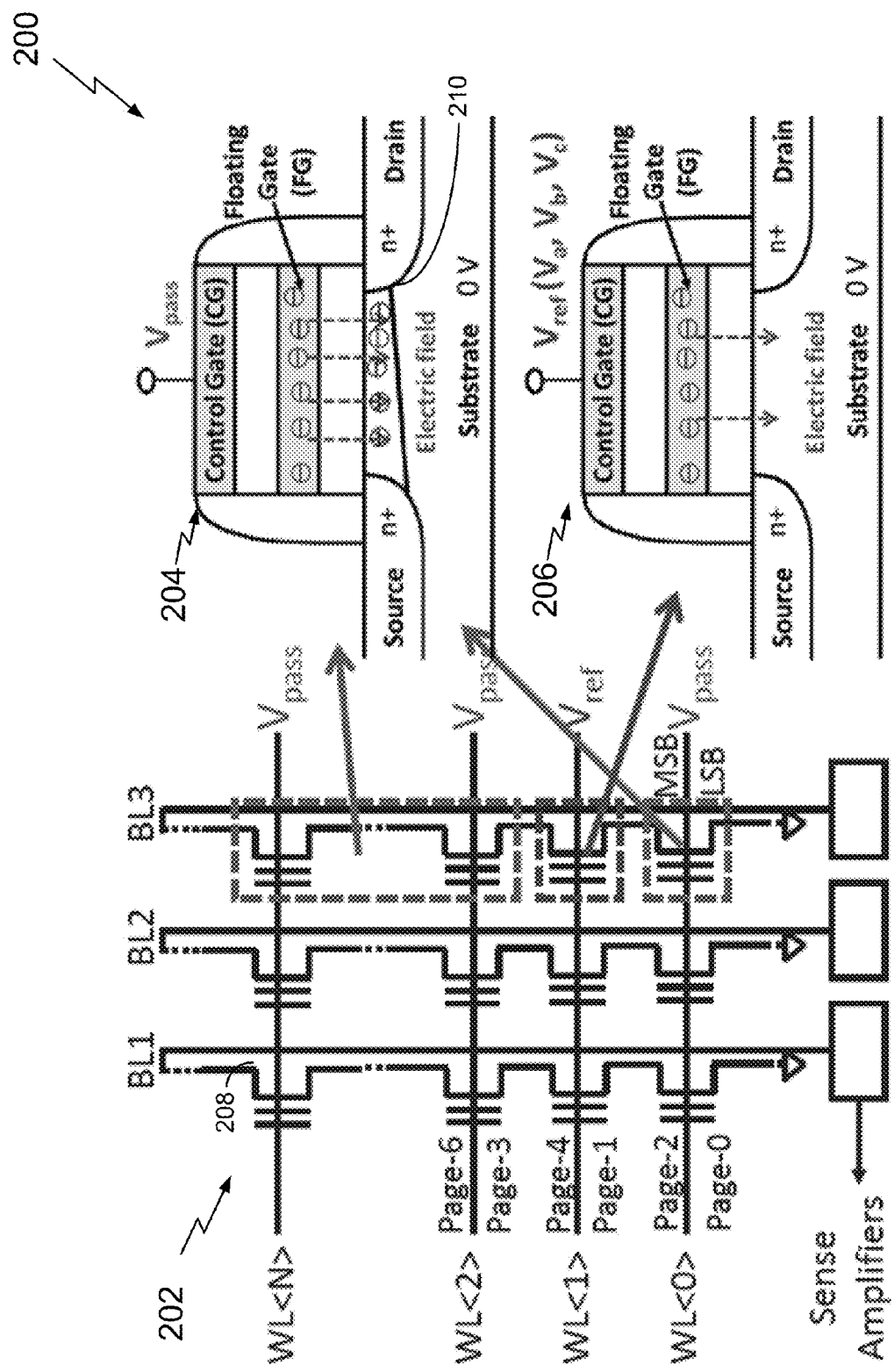
FIG. 2 illustrates a features of memory cells including a cross-sectional view of the memory cells.

FIG. 2 illustrates several different views of memory constructs 200. Diagram 202 includes a notional arrangement of memory cells that can corresponding to features of FIGS. 1A-1C. For example, BL1-BL3 of diagram 202 can be bitlines that can correspond to control lines 106*a*-106*c*. WL<0> through WL<N> can be wordlines that can correspond to control lines 112*a*-112*c*. The sense amplifiers can correspond to sense amplifiers 132-136. The transistors, such as transistor 208 can each correspond to one of planar memory cells 104. Each of the transistors can store multiple values as a corresponding analog voltage. For example, each of the memory cells can store one of four values and may be represented as a two bit value (e.g., 0b00, 0b01, 0b10, or 0b11). Thus, data stored within memory cells can be represented by corresponding least significant bits (LSBs) and most significant bits (MSBs). The LSBs and MSBs of a wordline can form a corresponding LSB or MSB page. As illustrated, Page-0 can form a LSB page of WL<0>, Page-2 can from a MSB of WL<0>, Page-1 can form a LSB of WL<1>, etc. As disclosed herein, various values of read reference voltages can be applied to a corresponding wordline in order to determine the corresponding values of data stored within a LSB or MSB page.

As illustrated, a voltage (Vpass) that causes transistors to conduct can be applied to WL<N>, WL<2>, and WL<0>. The state of the transistors with Vpass applied is illustrated by diagram 204. Illustrated is exemplary NAND flash memory which can include a floating gate transistor with a control gate (CG) connected to the worldine and the source and drain connect to neighboring memory cells. The amount of charge stored in the floating gate can determine the threshold voltage of the transistor to cause the transistor to conduct and, thus, the value stored therein. As illustrated in diagram 204, a Vpass can induce a tunnel to form through a substrate between a source and a drain. As illustrated by diagram 206, a reference voltage (e.g., Va, Vb, and Vc) can be applied to a CG of the floating gate (FG). If the reference voltage is sufficient, a tunnel (similar to tunnel 210) can be induced through a substrate and the floating gate can conduct.

A LSB page can be read by inducing a single reference voltage (e.g., Vb) to a wordline. If the transistors of the wordline conduct, then the corresponding sense amplifiers can determine that the transistors are in a state wherein the data stored by the transistors includes the LSB being set. In a similar fashion, progressively higher reference voltages can be applied to the wordline to determine a MSB page. However, depending on the organization of the memory, two voltages may need be applied to determine whether a MSB for a transistor is set. For example, a voltage between a ground reference and Vb can be applied and, sequentially, a voltage between Vb and Vpass. Depending on whether the transistor conducts upon application of the various reference voltages, a LSB and MSB for the transistor can be determined.

An electric charge can be injected into a floating gate during a read or write operations through a Fowler-Nordheim (FN) tunneling effects which can create an electrical tunnel between a floating gate and a corresponding substrate. The FN tunnel can be triggered by an electric field passing through a tunnel and can be proportional to a voltage applied to a CG and an amount of charge stored in the floating gate. As disclosed herein, during a read operation, a voltage can be induced on memory cells other than those being read (for example, memory cells 114-118 and 126-130 when reading memory cells 120-124 as illustrated in FIG. 1B).

Figure 3:
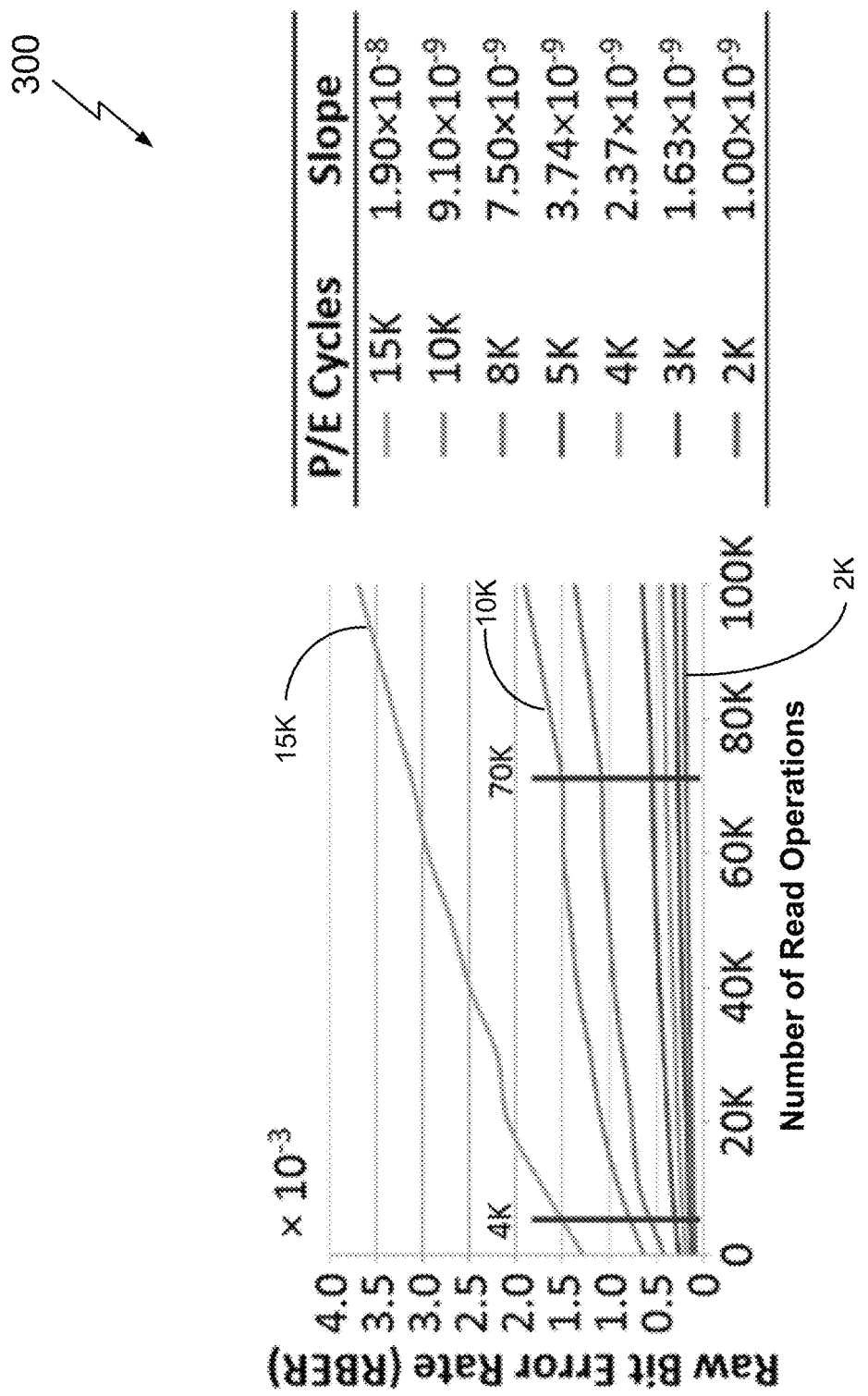
FIG. 3 illustrates a graph of certain features of the disclosure.

FIG. 3 illustrates a chart 300 illustrating features of the disclosure. Chart 300 includes several slopes of lines representing curves of error rates after a certain number of read operations are performed on a group of memory cells for differing memory conditions. As disclosed herein, the read operations can induce a voltage on memory cells other than target memory cells to be read, possibly inducing errors into the memory. The memory conditions illustrated are program/erase cycles (PECs) that have been performed on the group of memory cells. As illustrated, increased PECs can cause memory to becomes more susceptible to errors induced by read operations. Furthermore, the slope of numbers of read operations that cause an unacceptable error rate can change depending on a number of PECs that a group of memory cells has been subjected to.

An error rate may become unacceptable if the error rate exceeds an ability of a memory controller to account for errors. For example, error code correcting (ECC) techniques can be used to mitigate some memory errors. However, a number of errors introduced by read operations can exceed an acceptable error rate that may be mitigating using ECC techniques. As illustrated, given an acceptable error rate of 0.15%, a group of memory cells that has been subjected to 15K PECs may be likely to be susceptible to errors introduced by read operations after 4 k read operations. The same group of memory cells, after being subjected to only 10 k PECs, may be capable of being subjected to 70 k read operations before an unacceptable number of errors are introduced. Thus, as illustrated, depending on a number of PECs that memory has been subjected to can be used to determine a number of a read operations (e.g., a threshold number of read operations) that memory may be subjected to without encountering an unacceptably high error rate induced by the read operations.

Figure 4:
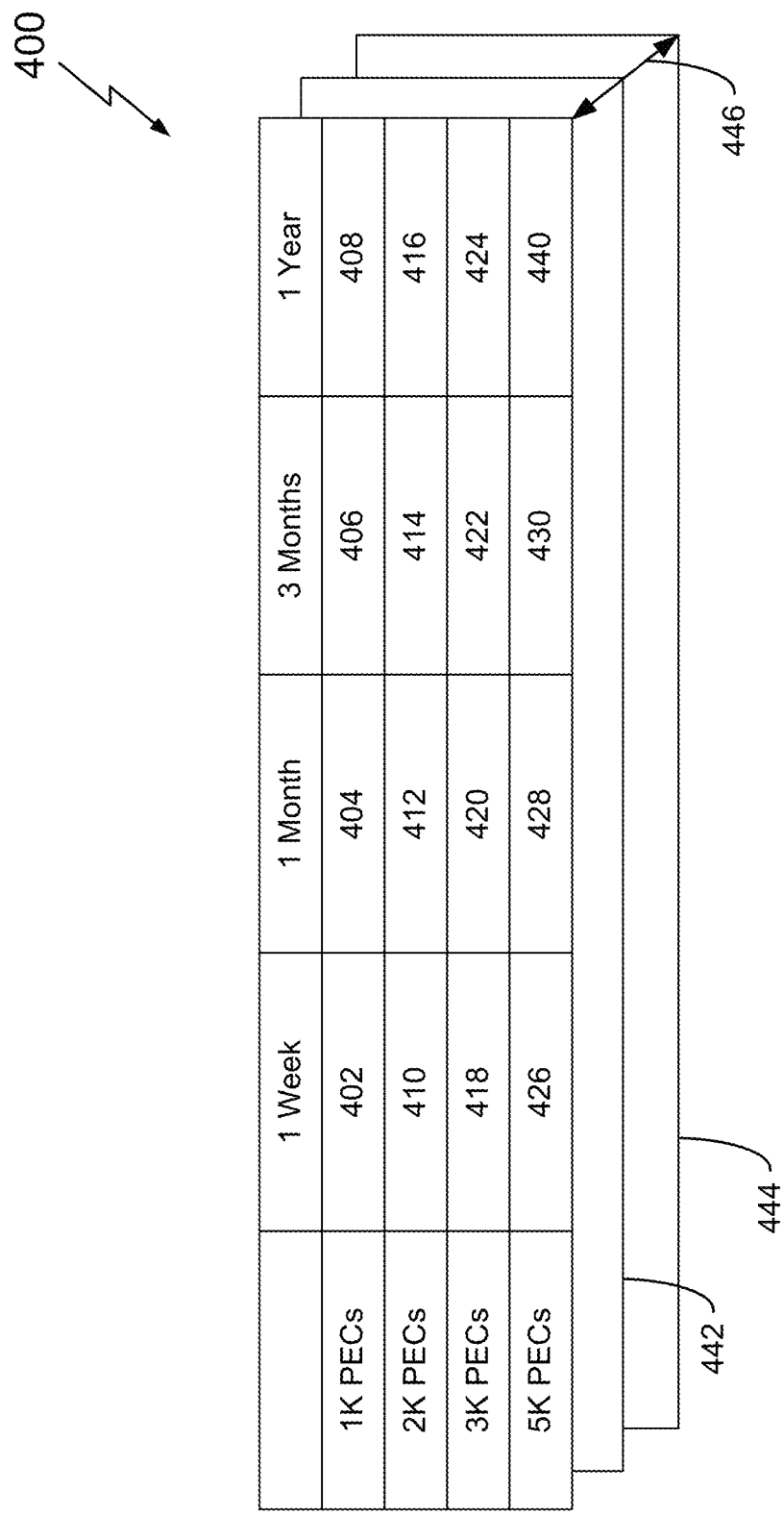
FIG. 4 illustrates tables including features of the disclosure.

FIG. 4 illustrates a table 400 that can include features of the disclosure. For example, table 400 can include columns that each represents a retention time. The retention time can indicate an amount of time that a memory cell has retained a data value (e.g., via an electrical charge). Table 400 can include rows that each represents a corresponding number of PECs. The table can include various values of numbers of threshold read operations 402-440 for corresponding conditions (e.g., PEC cycles and/or retention times). Also, as illustrated, additional level 442 and 444 can be included in another dimension 446 of table 400 that can correspond to another condition of memory cells. Levels 442 and 444 can include, for example, a humidity or temperature that memory cells are subjected to. The humidity or temperature can be determined via a sensor of sensor unit 138, for example. Other example conditions can include, for example, a number of physical shocks or an amount of radiation that the memory has been subjected to, a manufacturing process, a lot number of manufactured memory, or other condition(s).

For example, a memory chip can be manufactured and tested, prior to final assembly, to determine a level of susceptibility of the memory to errors introduced by read operations. The level of susceptibility can be encoded within the memory. A controller, such as controller 102, can determine, based on the encoded level of susceptibility, a number of read operations that can be performed on the memory before performing a read reclaim operation to prevent an unacceptably high error rate of data stored in the memory. In certain embodiments, memory can be tested by a controller, such as controller 102, to test and determine a number of read operations that a memory can be subjected to before an unacceptably high error rate is induced.

Table 400 can be stored and be accessible by a controller. By storing table 400, several reference values for read operation numbers can be stored. This may prevent overhead associated with, for example, a controller from calculating numbers of read operations before triggering a read reclaim operation. In certain embodiments, table 400 can be used to store baseline values that may be adjusted based on one or more operational conditions of memory.

Figure 5:
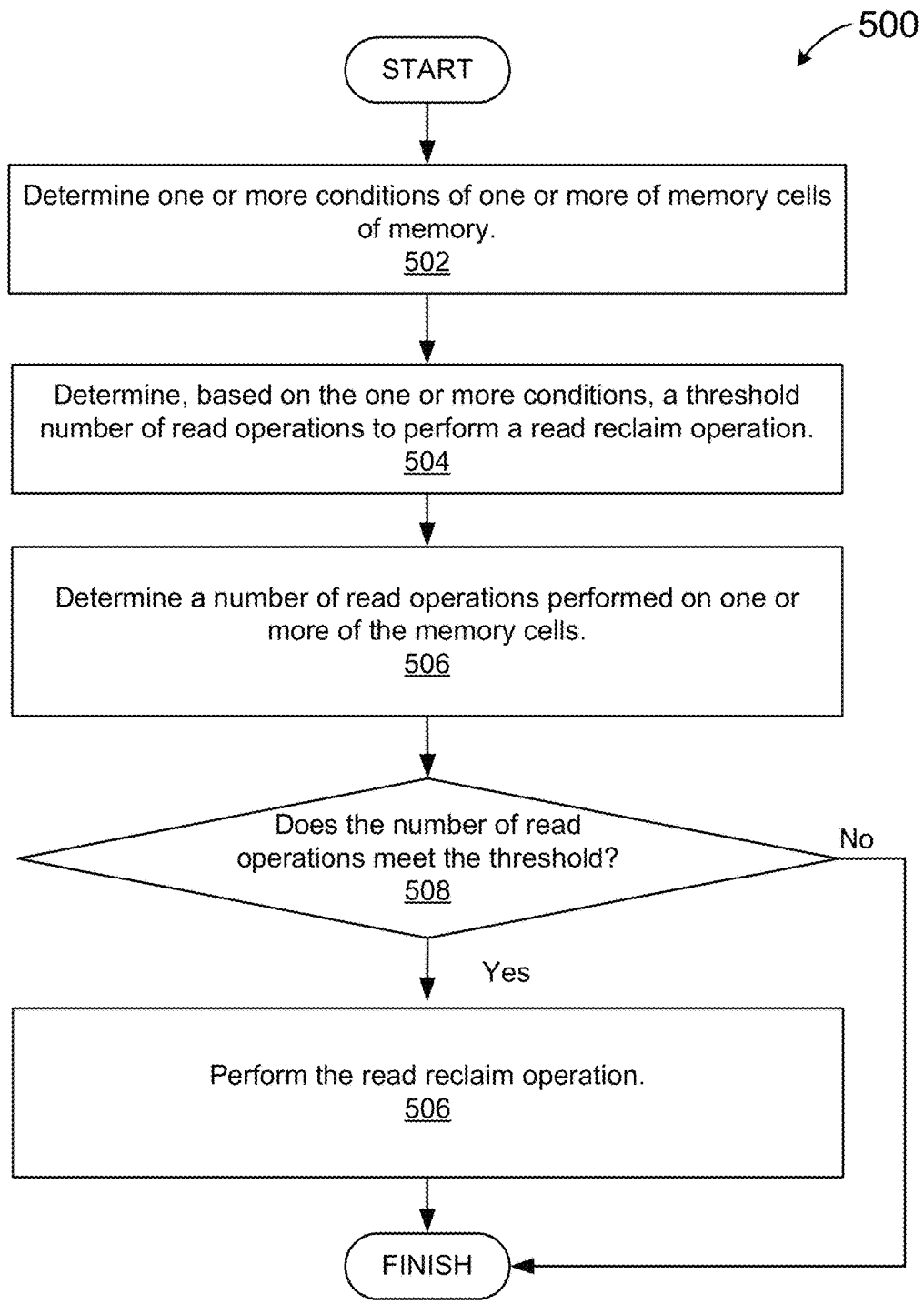
FIG. 5 is a simplified flow chart illustrating operation of a memory controller according to certain embodiments.

FIG. 5 is a simplified flow chart 500 illustrating a method to determine whether to perform a read reclaim operation according to certain embodiments of the disclosure. The techniques of flow chart 500 can be implemented by controller 102, for example. The techniques of flow chart 500 can be initiated upon initial startup of a solid state hard drive or other memory device, for example. At 502, one or more conditions of one or more of memory cells of memory can be determined. As disclosed herein, the one or more conditions can be determined in real time by, for example, a sensor coupled to the controller. The conditions may also be determined by testing the memory and/or reading a value indicating conditions for the memory, for example. At 504, based on the one or more conditions, a threshold number of read operations can be determined. The threshold number of read operations can be read from a table (such as table 400), for example. The threshold number of read operations can be calculated by a controller or be a combination of a stored reference value and a calculation. At 506, a number of read operations performed on one or more of the memory cells can be determined. At 508, a determination can be made if the number of read operations meets the threshold. If not, the method of chart 500 can end. If so, then, at 506, a read reclaim operation can be performed.

Figure 6:
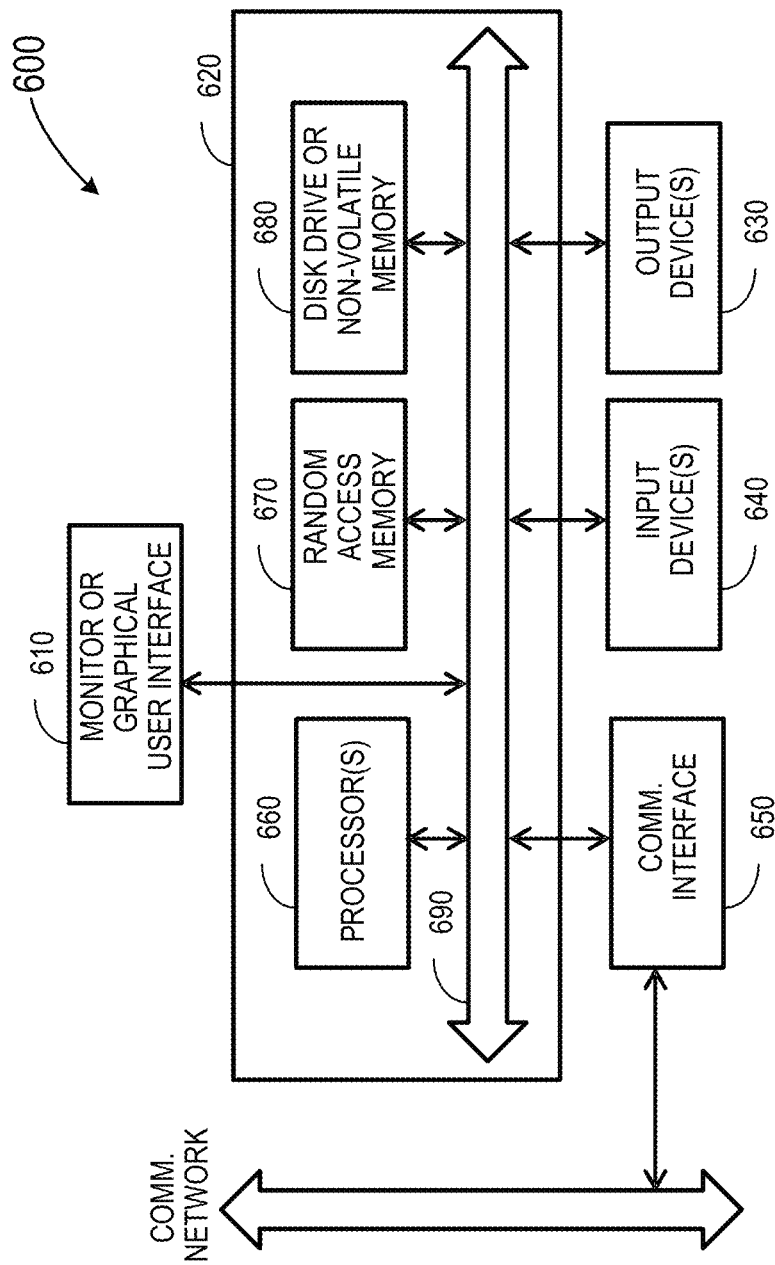
FIG. 6 is a simplified block diagram illustrating an apparatus that may be used to implement various embodiments according to the present invention.

FIG. 6 is a simplified block diagram illustrating an apparatus that may be used to implement various embodiments according the present invention. FIG. 6 is merely illustrative of an embodiment incorporating the present invention and does not limit the scope of the invention as recited in the claims. One of ordinary skill in the art would recognize other variations, modifications, and alternatives. In one embodiment, computer system 600 typically includes a monitor 610, a computer 620, user output devices 630, user input devices 640, communications interface 650, and the like.

As shown in FIG. 6, computer 620 may include a processor(s) 660 that communicates with a number of peripheral devices via a bus subsystem 690. These peripheral devices may include user output devices 630, user input devices 640, communications interface 650, and a storage subsystem, such as random access memory (RAM) 670 and disk drive 680.

User input devices 640 can include all possible types of devices and mechanisms for inputting information to computer system 620. These may include a keyboard, a keypad, a touch screen incorporated into the display, audio input devices such as voice recognition systems, microphones, and other types of input devices. In various embodiments, user input devices 640 are typically embodied as a computer mouse, a trackball, a track pad, a joystick, wireless remote, drawing tablet, voice command system, eye tracking system, and the like. User input devices 640 typically allow a user to select objects, icons, text and the like that appear on the monitor 610 via a command such as a click of a button or the like.

User output devices 630 include all possible types of devices and mechanisms for outputting information from computer 620. These may include a display (e.g., monitor 610), non-visual displays such as audio output devices, etc.

Communications interface 650 provides an interface to other communication networks and devices. Communications interface 650 may serve as an interface for receiving data from and transmitting data to other systems. Embodiments of communications interface 650 typically include an Ethernet card, a modem (telephone, satellite, cable, ISDN), (asynchronous) digital subscriber line (DSL) unit, FireWire interface, USB interface, and the like. For example, communications interface 650 may be coupled to a computer network, to a FireWire bus, or the like. In other embodiments, communications interfaces 650 may be physically integrated on the motherboard of computer 620, and may be a software program, such as soft DSL, or the like.

In various embodiments, computer system 600 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 620 includes one or more Xeon microprocessors from Intel as processor(s) 660. Further, one embodiment, computer 620 includes a UNIX-based operating system.

RAM 670 and disk drive 680 are examples of tangible storage media configured to store data such as embodiments of the present invention, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 670 and disk drive 680 may be configured to store the basic programming and data constructs that provide the functionality of the present invention.

Software code modules and instructions that provide the functionality of the present invention may be stored in RAM 670 and disk drive 680. These software modules may be executed by processor(s) 660. RAM 670 and disk drive 680 may also provide a repository for storing data used in accordance with the present invention.

RAM 670 and disk drive 680 may include a number of memories including a main random access memory (RAM) for storage of instructions and data during program execution and a read only memory (ROM) in which fixed non-transitory instructions are stored. RAM 670 and disk drive 680 may include a file storage subsystem providing persistent (non-volatile) storage for program and data files. RAM 670 and disk drive 680 may also include removable storage systems, such as removable flash memory.

Bus subsystem 690 provides a mechanism for letting the various components and subsystems of computer 620 communicate with each other as intended. Although bus subsystem 690 is shown schematically as a single bus, alternative embodiments of the bus subsystem may utilize multiple busses.

FIG. 6 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
a flash memory comprising memory cells, the memory cells arranged such that reading a selected memory cell includes applying a voltage to the selected memory cell, wherein the voltage is also applied to one or more memory cells other than the selected memory cell;
a controller coupled to the memory, the controller configured to:
determine one or more conditions of one or more of the memory cells;
access a plurality of threshold numbers of read operations stored in the memory;
select from the plurality of threshold numbers of read operations, based on the one or more conditions, a threshold number of read operations that triggers a read reclaim operation, wherein the read reclaim operation comprises copying data values from the one or more cells to another one or more cells to prevent the data values from being corrupted;
determine a number of read operations that has been performed on the one or more of the memory cells, wherein the one or more conditions are separate and distinct from the number of read operations;
determine whether the number of read operations meets the threshold number of read operations; and
in response to determining that the number of read operations meets the threshold number of read operations, perform the read reclaim operation.

2. The device of claim 1, wherein the controller is further configured to:
in response to determining that the number of read operations does not meet the threshold number of read operations, not perform the read reclaim operation.

3. The device of claim 1, wherein the controller is further configured to:
determine the threshold number of read operations from a baseline number of read operations, including modifying the baseline number of read operations based on the one or more conditions.

4. The device of claim 3, wherein the baseline number of read operations is determined based on an end-of-life projection for the one or more of the memory cells.

5. The device of claim 4, wherein the end-of-life projection is based on at least one of:
a worst case number of program erase cycles that the one or more of the memory cells is anticipated to be subjected to over an operational lifetime; or
a worst case retention time for the one or more of the memory cells to store data without degradation.

6. The device of claim 1, wherein the one or more conditions include a number of program and erase cycles that the one or more memory cells have been subjected to, wherein the controller is configured to keep track of the number of program and erase cycles that the one or more memory cells have been subjected to.

7. The device of claim 1, wherein the one or more conditions include a retention time that the one or more cells have maintained a value of data stored therein, wherein the retention time is based on a time that the memory cell was last written to, wherein the controller is configured to keep track of the time that the memory cell is last written to.

8. The device of claim 1, wherein the one or more conditions include a temperature determined by a sensor coupled to the memory.

9. The device of claim 1, wherein the one or more conditions include a humidity determined by a sensor coupled to the memory.

10. The device of claim 1, wherein the controller is configured to access a table stored in the memory to access a plurality of threshold numbers of read operations stored in the memory as functions of the one or more conditions of the memory cell.

11. The device of claim 10, wherein the table comprises decreasing threshold number of memory read operations for increasing retention time, wherein the retention time is a time that the memory cell was last written to.

12. The device of claim 10, wherein the table comprises decreasing threshold number of memory read operations for increasing number of program/erase cycles that the one or more memory cells have been subjected to.

13. The device of claim 1, wherein the controller is further configured to:
store a plurality of threshold numbers of read operations, each of the plurality of threshold numbers of read operations corresponding to a set of one or more conditions of the memory cells; and
wherein determining the threshold number of read operations includes selecting, from the plurality of threshold numbers of read operations, the threshold number of read operations.

14. The device of claim 1, wherein the memory cells are arranged in a planar array wherein the one or more memory cells are addressed via row and column addressing.

15. A non-transitory computer readable medium storing instructions that, when executed by one or more processors, cause the one or more processors to:
determine one or more conditions of one or more of memory cells of a flash memory, the memory cells arranged such that reading a selected memory cell includes applying a voltage to the selected memory cell, wherein the voltage is also applied to one or more memory cells other than the selected memory cell;
determine a threshold number of read operations from a baseline number of read operations, including modifying the baseline number of read operations based on the one or more conditions, the threshold number of read operations triggering a read reclaim operation, wherein the read reclaim operation comprises copying data values from the one or more cells to another one or more cells to prevent the data values from being corrupted;
determine a number of read operations performed that has been performed on the one or more of the memory cells, wherein the one or more conditions are separate and distinct from the number of read operations;

determine whether the number of read operations meets the threshold number of read operations; and in response to determining that the number of read operations meets the threshold number of read operations, perform the read reclaim operation.

16. The non-transitory computer readable medium of claim 15, wherein the instructions further cause the one or more processors to determine one or more values corresponding to a respective one of the one or more conditions during operation of the one or more memory cells.

17. The non-transitory computer readable medium of claim 15, wherein the memory is flash memory; and wherein the reading the value of one of the memory cells includes applying a voltage to the others of the memory cells includes applying a voltage to a wordline of the flash memory.

18. A method, comprising:

determine one or more conditions of one or more of memory cells of a flash memory, the memory cells arranged such that reading a selected memory cell includes applying a voltage to the selected memory cell, wherein the voltage is also applied to one or more memory cells other than the selected memory cell;

store a plurality of threshold numbers of read operations, each of the plurality of threshold numbers of read operations corresponding to a set of one or more conditions of the memory cells;

determining, based on the one or more conditions, a threshold number of read operations, from the plurality of threshold numbers of read operations, prior to performing a read reclaim operation, wherein the read reclaim operation comprises copying data values from the one or more cells to another one or more cells to prevent the data values from being corrupted;

determining a number of read operations performed on one or more of the memory cells, wherein the one or more conditions are separate and distinct from the number of read operations;

determining whether the number of read operations meets the threshold number of read operations; and in response to determining that the number of read operations meets the threshold number of read operations, performing the read reclaim operation.

19. The method of 18, further comprising dynamically determining one or more values corresponding to a respective one of the one or more conditions during operation of the one or more memory cells.

20. The method of 18, wherein the memory is flash memory; and wherein the reading the value of one of the memory cells includes applying a voltage to the others of the memory cells and includes applying a voltage to a wordline of the flash memory.

* * * * *